US007276777B2

(12) United States Patent
Radulescu

(10) Patent No.: US 7,276,777 B2
(45) Date of Patent: Oct. 2, 2007

(54) THIN FILM RESISTOR AND METHOD OF MAKING THE SAME

(75) Inventor: Fabian Radulescu, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 152 days.

(21) Appl. No.: 11/192,916

(22) Filed: Jul. 29, 2005

(65) Prior Publication Data

US 2007/0023863 A1 Feb. 1, 2007

(51) Int. Cl.
*H01L 29/00* (2006.01)

(52) U.S. Cl. ...................................... 257/537; 257/536

(58) Field of Classification Search ......... 257/530–537
See application file for complete search history.

(56) References Cited

U.S. PATENT DOCUMENTS 5,780,920 A * 7/1998 Prall et al. .................. 257/536
6,156,618 A 12/2000 Lee
6,727,556 B2 * 4/2004 Shiiki et al. ................ 257/536
6,890,810 B2 * 5/2005 Amadon et al. ............ 257/536
7,211,494 B2 * 5/2007 Danzl ......................... 257/536
2002/0192853 A1 12/2002 Behammer

FOREIGN PATENT DOCUMENTS

JP 05270251 12/1995

* cited by examiner

*Primary Examiner*—Cuong Nguyen
(74) *Attorney, Agent, or Firm*—Ingrid McTaggart

(57) ABSTRACT

One embodiment of an integrated circuit includes a substrate and a SiWNi thin film resistor formed on the substrate.

15 Claims, 1 Drawing Sheet

22
20
10
18
16
14
12

THIN FILM RESISTOR AND METHOD OF MAKING THE SAME

BACKGROUND

Integrated circuits may include thin film resistors when high precision resistance values are desired. In general, the higher the film sheet resistance, the smaller the layout footprint that may be utilized. Accordingly, it may be desirable to provide a thin film resistor having a high film sheet resistance so that a small layout footprint may be utilized on the integrated circuit.

DETAILED DESCRIPTION OF THE DRAWINGS

Figure 1:
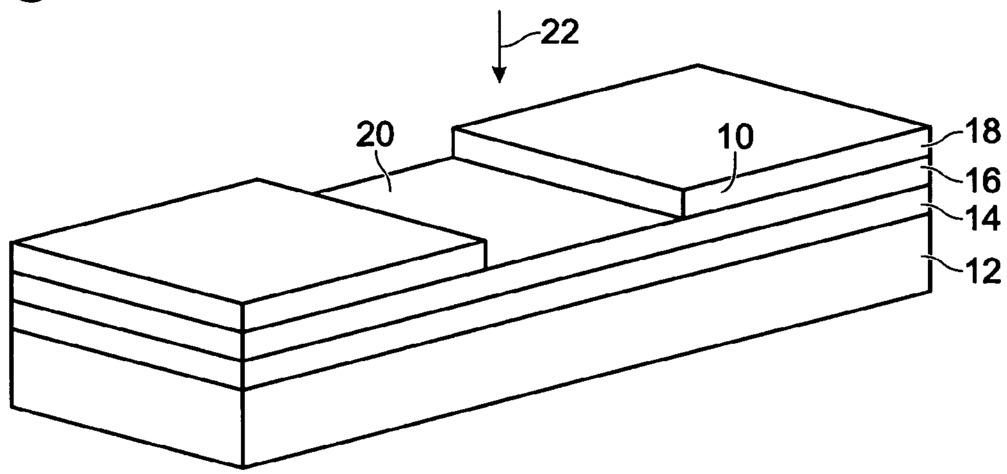
FIG. 1 is a schematic cross-sectional side view of one embodiment of an integrated circuit including one embodiment of a thin film resistor.

FIG. 1 is a schematic cross-sectional side view of one embodiment of an integrated circuit 10 including one embodiment of a thin film resistor. In the embodiment shown, integrated circuit 10 may include a substrate 12, such as a gallium arsenide or silicon substrate, having an insulator, for example an oxide or nitride, layer 14 formed on substrate 12. A thin film resistor layer 16 may be formed on oxide layer 14 and a metal layer 18 may be formed on thin film resistor layer 16. Metal layer 18 may be a gold layer, for example, and thin film resistor layer 16 may be formed of a silicon tungsten nickel (SiWNi) alloy. Each of the layers of integrated circuit 10 may be formed by any method of layer formation, such as by physical vapor deposition (PVD). Any arrangement, number, and/or type of layers may be utilized on an integrated circuit that includes thin film resistor 16. The integrated circuit 10 shown is only one embodiment that is shown for illustration purposes only. Moreover, an integrated circuit 10 including thin film resistor 16 of the present invention may be patterned by any suitable method.

Thin film resistor layer 16 may be formed by sputtering using a target having an alloy formula, in one embodiment, consisting of 75 atomic percentage (75 at %) of silicon (Si), 20 at % tungsten (W), and 5 at % of nickel (Ni). In other embodiments, the silicon atomic percentage may be in a range of 60 to 95 at %, the tungsten atomic percentage may be in a range of 5 to 30 at %, and the nickel atomic percentage may be in a range of greater than zero to fifteen at %. Such a composition of the sputtering target will result in a thin film resistor having a composition substantially the same as the target composition, i.e., in the example embodiment, a thin film resistor having a composition of Si—W—Ni of approximately 75-20-5 at %. Such a Si—W—Ni thin film resistor may display a sheet resistance value of greater than 900 ohm/sq (ohms per square) with a TCR (temperature coefficient of resistance) of −700 ppm/C. (parts per million per degree Celsius) and approximately 1,000 ohm/sq with TCR of −700 ppm/C. Such a sheet resistance value may allow a substantial size reduction of the footprint 20 of integrated circuit 10, such as a ten percent reduction or more, wherein footprint 20 of integrated circuit 10 may be defined as the cross sectional area 20 when viewed from a direction 22 above integrated circuit 10.

Figure 2:
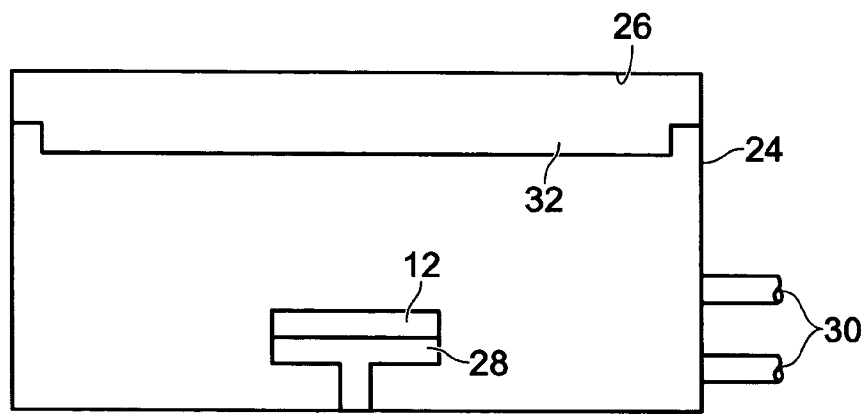
FIG. 2 is a schematic cross-sectional side view of one embodiment of a deposition chamber for forming one embodiment of a thin film resistor.

FIG. 2 is a schematic cross-sectional side view of one embodiment of a deposition chamber 24 for forming one embodiment of a thin film resistor 16. Deposition chamber 24 may include an interior 26 that may include a support 28 for supporting substrate 12 during the process of forming thin film resistor 16. Chamber 24 may further include one or more gas or plasma input/output ports 30 for the input of reactants and/or inert gas(es) into and out of interior 26 of chamber 24. One or more deposition targets 32 may be positioned within interior 26 and generally above support 28.

Deposition target 32, as stated above, is manufactured of a silicon—tungsten—nickel alloy, such as an alloy having a silicon atomic percentage in a range of 60 to 95 at %, a tungsten atomic percentage in a range of 5 to 30 at %, and a nickel atomic percentage in a range of greater than zero to fifteen at %, and in one embodiment, a composition of Si—W—Ni of approximately 75-20-5 at %. In one embodiment of a thin film resistor fabrication process, the following parameters may be utilized within deposition chamber 24: a base pressure within interior 26 of deposition chamber 24 may be in a range of 5e-6 to 1e-8 torr (T); Argon may be introduced to interior 26 at a pressure in a range of 1 to 8 millitorr (mT) at 20 to 100 standard cubic centimeters per minute (sccm) flow rate; the power applied on the target in a range of 0.2 to 1.5 kilowatts (kW); the deposition time may be in a range from 13 to 120 seconds; the integrated circuit wafer 10 may be at a temperature in a range of 30 to 70 degrees Celsius (C.); and the thickness of deposited thin film resistor layer 16 may be in a range of 50 to 200 Angstroms (A). Other parameters may be utilized as applicable for the fabrication of different embodiments of thin film resistor 16.

Figure 3:
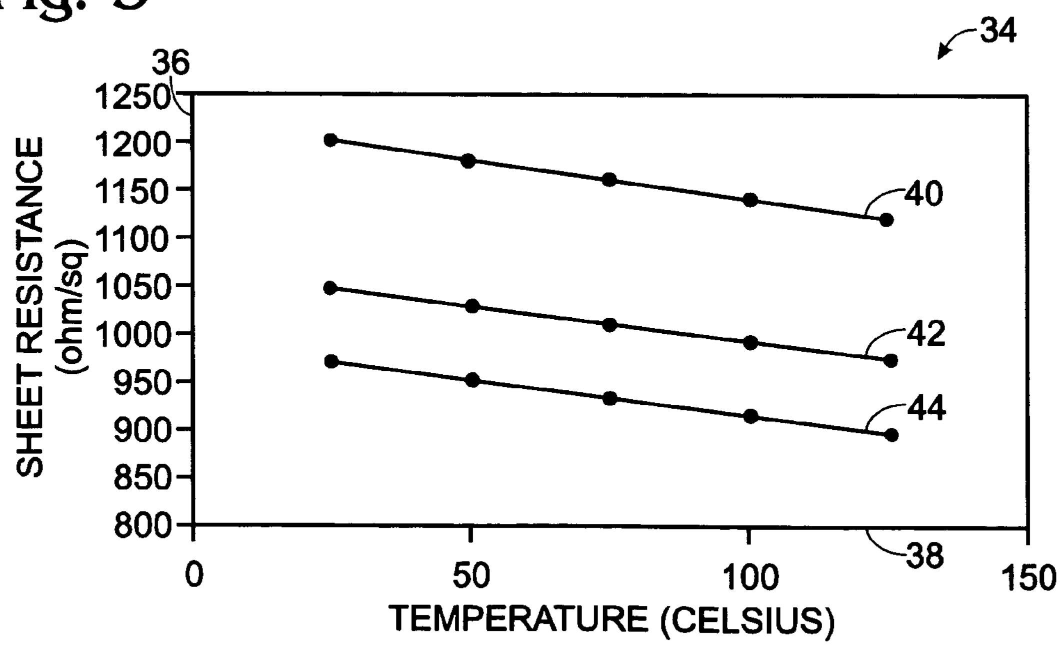
FIG. 3 is a chart showing resistance values versus temperature for several embodiments of a thin film resistor.

FIG. 3 is a chart 34 showing resistance values 36 (Y-axis) in ohms versus temperature 38 (X-axis) in degrees Celsius for three integrated circuits 40, 42 and 44, each integrated circuit including a thin film resistor 16 having a composition of Si—W—Ni at 75-20-5 at %. Integrated circuit 40 has a thin film resistor 16 having a temperature coefficient of resistance of approximately −685 ppm/C. Integrated circuit 42 has a thin film resistor 16 having a temperature coefficient of resistance of approximately −690 ppm/C. Integrated circuit 44 has a thin film resistor 16 having a temperature coefficient of resistance of approximately −720 ppm/C.

Other variations and modifications of the concepts described herein may be utilized and fall within the scope of the claims below.

I claim:

1. An integrated circuit, comprising:

a substrate; and a SiWNi thin film resistor formed on said substrate.

2. The circuit of claim 1 wherein said SiWNi resistor has a composition of substantially 75-20-5 atomic percent, respectively, of silicon, tungsten and nickel.

3. The circuit of claim 1 further comprising an insulating layer positioned between said substrate and said SiWNi resistor.

4. The circuit of claim 3 wherein said insulating layer is chosen from one of an oxide and a nitride.

5. The circuit of claim 1 wherein said SiWNi resistor includes a silicon atomic percentage in a range of 60 to 95 at %, a tungsten atomic percentage in a range of 5 to 30 at %, and a nickel atomic percentage in a range of greater than zero to fifteen at %.

6. The circuit of claim 1 further comprising a metal layer formed on said SiWNi resistor.

7. The circuit of claim 1 wherein said SiWNi resistor has a resistance value of greater than 900 ohms per square sheet resistance with a temperature coefficient of resistance of −700 part per million per degree Celsius.

8. The circuit of claim 1 wherein said SiWNi resistor comprises a layer having a thickness in a range of 50 to 200 Angstroms.

9. An integrated circuit, comprising:

a substrate; and a resistor layer formed on said substrate, said resistor layer including silicon, tungsten and nickel, said nickel present in an atomic percentage in a range of greater than zero to fifteen at % of said resistor layer.

10. The circuit of claim 9 wherein said resistor layer includes a silicon atomic percentage in a range of 60 to 95 at %, and a tungsten atomic percentage in a range of 5 to 30 at %.

11. The circuit of claim 9 wherein said resistor layer has a composition of substantially 75-20-5 atomic percent, respectively, of silicon, tungsten and nickel.

12. The circuit of claim 9 wherein said resistor layer has a thickness in a range of 50 to 200 Angstroms.

13. The circuit of claim 9 wherein said resistor layer has a resistance value of greater than 900 ohms per square sheet resistance with a temperature coefficient of resistance of substantially 700 parts per million per degree Celsius.

14. An integrated circuit, comprising:

a substrate; and a resistor layer formed on said substrate, said resistor layer consisting essentially of silicon, tungsten and nickel.

15. The circuit of claim 14 wherein said nickel is present in an atomic percentage in a range of greater than zero to fifteen at % of said resistor layer.

* * * * *